United States Patent [19]
Tseng

[11] Patent Number: 5,587,338
[45] Date of Patent: Dec. 24, 1996

[54] POLYSILICON CONTACT STUD PROCESS

[75] Inventor: Horng-Huei Tseng, Hsin Chu, Taiwan

[73] Assignee: Vanguard International Semiconductor Corporation, Hsin-Chu, Taiwan

[21] Appl. No.: 428,493

[22] Filed: Apr. 27, 1995

[51] Int. Cl.⁶ .................................................. H01L 21/44
[52] U.S. Cl. ...................... 437/186; 156/628.1; 437/200
[58] Field of Search ..................... 437/186, 191, 437/193, 200, 245, 246; 148/DIG. 43; 156/657.1, 628.1

[56]  References Cited

U.S. PATENT DOCUMENTS

| | | |
|---|---|---|
| 4,554,728 | 11/1985 | Shepard . |
| 4,818,723 | 4/1989 | Yen ........................................... 437/200 |
| 5,010,039 | 4/1991 | Ku et al. .................................. 437/228 |
| 5,055,427 | 10/1991 | Haskell ..................................... 437/203 |
| 5,182,232 | 1/1993 | Chhabra et al. ......................... 437/200 |
| 5,183,781 | 2/1993 | Nakano .................................... 437/191 |
| 5,196,373 | 3/1993 | Beason ..................................... 437/203 |
| 5,279,705 | 1/1994 | Tanaka ..................................... 156/653 |
| 5,316,978 | 5/1994 | Boyd et al. .............................. 437/203 |
| 5,326,722 | 7/1994 | Huang ...................................... 437/186 |

FOREIGN PATENT DOCUMENTS

| | | |
|---|---|---|
| 0286135 | 3/1990 | Japan . |
| 0434933 | 2/1992 | Japan . |

*Primary Examiner*—George Fourson
*Assistant Examiner*—C. Everhart
*Attorney, Agent, or Firm*—George O. Saile

[57]  ABSTRACT

A process for creating a polysilicon contact stud, to connect overlying metallizations, to underlying active device regions in a semiconductor substrate, has been developed. After filling a contact hole with insitu doped polysilicon, and overlying with a titanium film, an anneal cycle is performed to convert the unwanted portions of polysilicon to titanium silicide. The silicide is then selectively removed, leaving polysilicon only in the contact hole, thus resulting in the desired stud configuration.

24 Claims, 4 Drawing Sheets

POLYSILICON CONTACT STUD PROCESS

BACKGROUND OF THE INVENTION

(1) Field of the Invention

The present invention relates to the fabrication methods used for semiconductor devices, and more specifically to a optimized process for creating the interconnecting contact stud, between the active device region and the overlying metallization.

(2) Description of Prior Art

The trend in the semiconductor industry has been to fabricate the smallest allowable devices, without sacrificing performance or reliability. By creating smaller devices, more chips per wafer will result, thus allowing a reduction in cost to be achieved. The trend to micro-miniaturazation, in terms of achieving sub-micron images for specific device elements, has largely occured as a result of advances in the photolithographic technology. The development of more sophisticated exposure cameras, as well as the development of more sensitive photoresist materials, have allowed sub-micron images in photoresist to be routinely obtained. In addition, similar advances in the dry etching discipline, has in turn allowed the sub-micron image in photoresist to be successfully transferred to an underlying semiconductor material, used for the fabrication of silicon devices. Advances in other fabrication sectors, such as ion implantation, (I/I), and low pressure chemical vapor deposition, (LPCVD), have also, contributed to the realization of semiconductor micro-miniaturazation.

Therefore although smaller specific device elements can be created via advances in semiconductor fabrication disciplines, usually resulting in performance, as well as cost improvements, these smaller elements can sometimes be more vulnerable to reliability concerns, then the larger dimensioned counterparts. For example, the interconnection between an active device element, in the semiconductor substrate, and an overlying metallization, is usually achieved via a metal stud or plug. The trend to sub-micron dimensions can result in a design in which the stud or plug has a much smaller cross-sectional area then the larger stud used for the less demanding, previous technology. However the current carrying capabilities for the smaller stud has not been relaxed, therefore resulting in increasing demands on the electromigration resistance properties of the stud material.

A specific material use for studs, and also, exhibiting outstanding electromigration resistance, is polycrystalline silicon. Applications using polysilicon as a stud, plug or contact material, have featured the creation of a contact hole to the active device region, followed by the deposition of polysilicon and the removal of polysilicon, from unwanted areas. The major problem with the polysilicon plug sequence has been the removal of the unwanted material. Several methods, for removal of unwanted polysilicon have been attempted. For example, reactive ion etching, (RIE), has the selectivity to remove polysilicon from the unwanted regions, over an insulator, without significantly attacking the underlying insulator. However the problem with the RIE solution is the continued removal of the polysilicon, in the contact hole, during the overetch section of the RIE procedure. Another solution for the removal of unwanted polysilicon material is a chemical-mechanical polishing, (CMP), process, described by Boyd, et al, in U.S. Pat. No. 5,316,978. The CMP process offers excellent selectivity, and also does not result in a significant removal of polysilicon in the contact hole. However CMP processing adds complexity, as well as cost to the device fabrication sequence. The invention now detailed will show a simple procedure for removing unwanted material from the underlying dielectric, while leaving the desired stud material, unattacked in the contact area.

SUMMARY OF THE INVENTION

It is an object of this invention to provide an optimized process for the fabrication of a polysilicon stud, used to electrically connect active device regions in a semiconductor substrate, to an overlying metallization level.

It is another object of this invention to fill a contact hole, to active device regions in a semiconductor substrate, with insitu doped polysilicon.

It is still another object of this invention to convert the unwanted insitu doped polysilicon to titanium silicide.

It is still yet another object of this invention to selectively remove titanium silicide via wet etching processes.

In accordance with this present invention a method is described for fabricating a polysilicon contact stud, to active device regions in a semiconductor substrate. A composite dielectric of a silicon oxide underlay, and a silicon nitride overlay is used to passivate the active device region, in the silicon substrate. A contact hole is opened, to the active device regions in the silicon substrate, through the composite dielectric. An insitu doped polysilicon layer is deposited to a thickness that guarantees the complete filling of the contact hole. A layer of titanium is next deposited on the insitu doped polysilicon layer, followed by a anneal used to convert a specific thickness of the insitu doped polysilicon to titanium silicide. A wet etching procedure is then used to selectively remove titanium silicide, leaving only insitu doped polysilicon in the contact hole.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of forming MOSFET devices, via use of a polysilicon contact stud structure, will now be covered in detail. The polysilicon contact stud structure, can be used as part of any specific MOSFET device, now currently being manufactured in industry, therefore only specific areas unique to understanding this invention will be described in detail.

Figure 1:
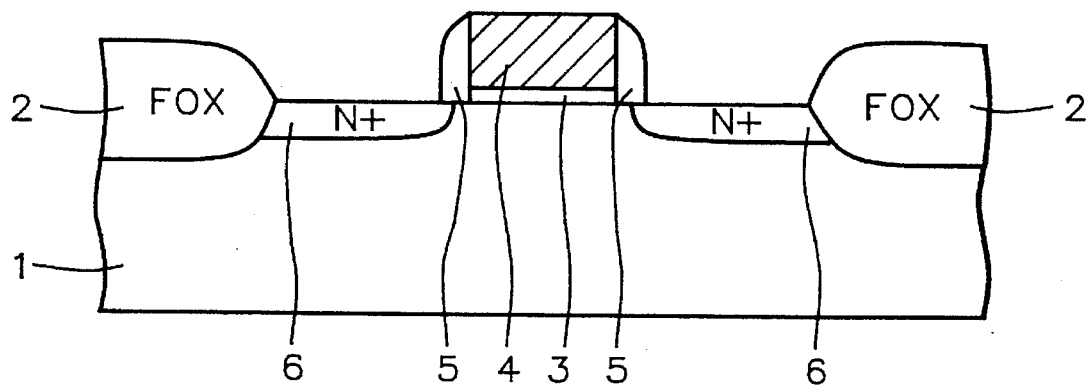
FIG. 1, which schematically, in cross-sectional representation, illustrates a specific metal oxide semiconductor field effect transistor, (MOSFET), device, prior to the initiation of the polysilicon contact stud process.

FIG. 1 shows a conventional NFET, (N-type FET), that will incorporate the polysilicon contact stud structure. A substrate, 1, composed of P type, single crystal silicon with a <100> orientation, is used. Next a thick field oxide region, 2, is formed surrounding the area where the active devices are to be constructed. The method used to create the FOX isolation is via use of a masking dielectric composite of a thin thermal oxide underlay, and a oxidation retarding, silicon nitride overlay. After the desired image is formed in photoresist, using conventional photolithographic procedures, the unmasked composite dielectric is removed via RIE processing, to expose the silicon region that will subsequently be converted to FOX, regions. After removal of the photoresist, followed by careful wet chemical cleans, the FOX insulator is thermally grown in an oxygen—steam ambient, at a temperature between about 850° to 1000° C., for a period of time needed to grow between about 4000 to 6000 Angstroms of silicon dioxide. After removal of the oxidation masking silicon nitride, via use of hot phosphoric acid, and the underlying thin silicon dioxide layer, in buffered hydrofluoric acid, a gate oxide, 3, is grown at a temperature between about 850° to 950° C., to a thickness between about 70 to 250 Angstroms. Next a LPCVD process is used to deposit a polysilicon layer, 4, at a temperature between, about 550° to 700° C., to a thickness between about 2000 to 4000 Angstroms. An ion implantation process is next employed for purposes of doping polysilicon layer, 4, via use of phosphorous, at an energy between about 50 to 100 Kev. at a dose between about 1E13 to 5E14 atoms/cm$^2$. Conventional photolithographic, and RIE processing, using $SF_6$ or $C_{12}$ based etchants, are used to create the polysilicon gate structure, 4, shown in FIG. 1. After photoresist removal, and careful wet cleans, a sidewall spacer is formed on the polysilicon gate structure. This is achieved by first using LPCVD techniques to deposit between about 2000 to 4000 Angstroms of silicon oxide. This is accomplished using tetraethylorthosilcate, as an oxide source, at a deposition temperature between about 500° to 700° C. Selective, anisotropic RIE procedures are then performed, using $CF_4$ and $H_2$, to create the sidewall spacer, 5. Another ion implantation step is now performed to create the source and drain regions, 6, using arsenic, ion implanted at an energy between about 50 to 100 Kev., at a dose between about 1E14 to 1E15 atoms/cm$^2$.

Figure 2:
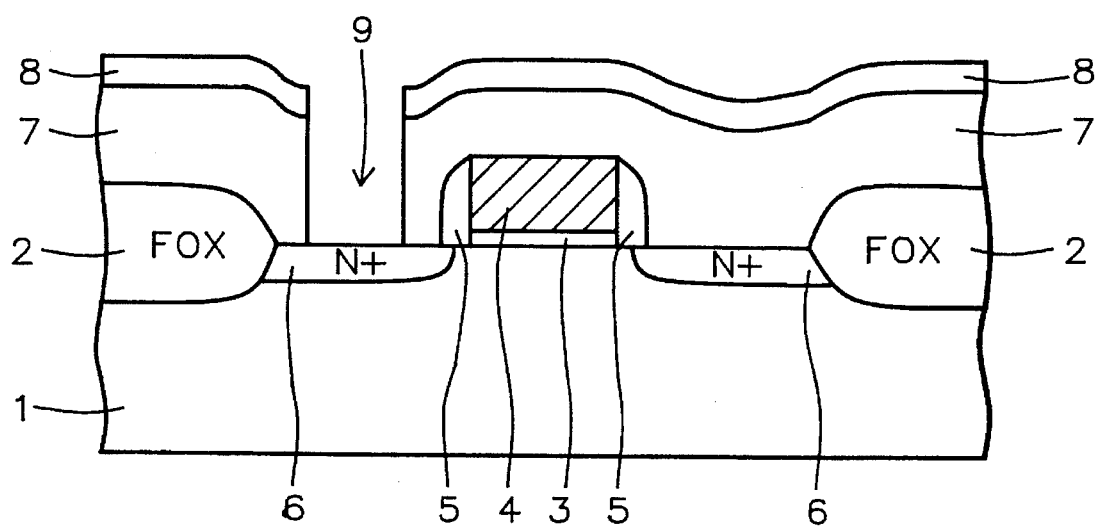
FIG. 2–7, which again in cross-sectional style, schematically describe the fabrication stages used to create the polysilicon contact stud.
Figure 8:
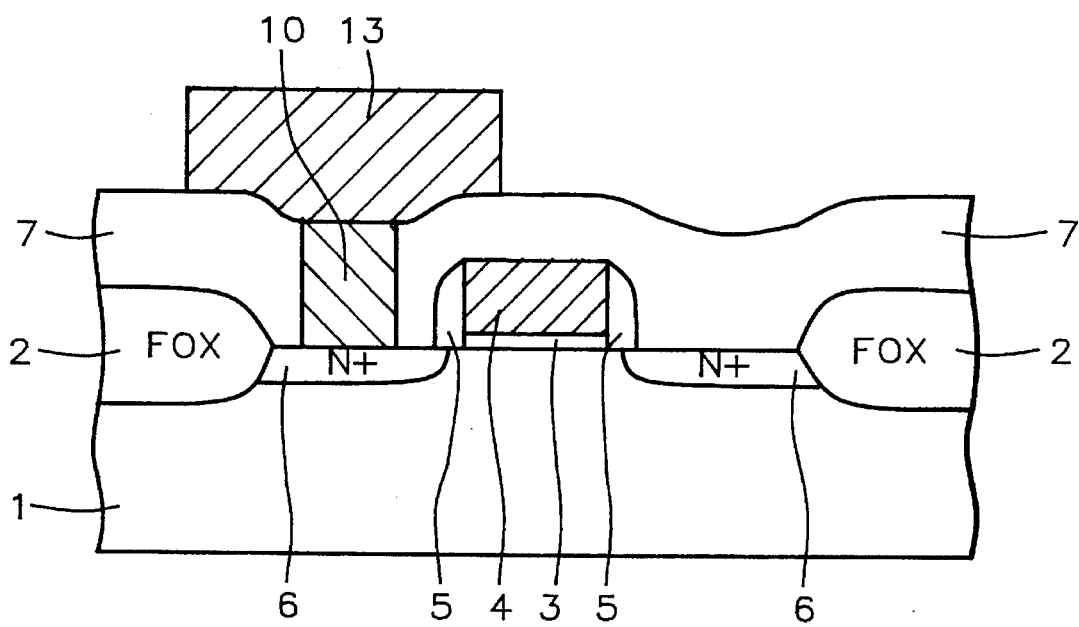
FIG. 8, which schematically shows a metallized MOSFET device, contacting active device regions in the underlying semiconductor substrate, via the use of a polysilicon contact stud.

FIG. 2 shows the construction of a contact hole to the active device regions in the silicon substrate. First a silicon oxide layer, 7, is deposited using the preferred LPCVD process, or either APCVD, (atmospheric pressure chemical vapor deposition), or PECVD, (plasma enhanced chemical vapor deposition), at a temperature between about 400° to 800° C., to a thickness between about 6000 to 12000 Angstroms, followed by another LPCVD deposition of silicon nitride, 8, at a temperature between about 600° to 800° C., to a thickness between about 500 to 3000 Angstroms. Conventional photolithographic procedures are employed to open a region in photoresist, that will expose the location in which the underlying composite dielectric is to be removed. Reactive ion etching of the exposed region of the composite dielectric, silicon nitride, 8, and silicon oxide, 7, is performed to open contact hole, 9, to expose the source and drain region, 6, in the silicon substrate. Photoresist removal, followed again by careful wet chemical cleans, conclude the contact hole formation process, shown schematically in FIG. 8.

Figure 3:
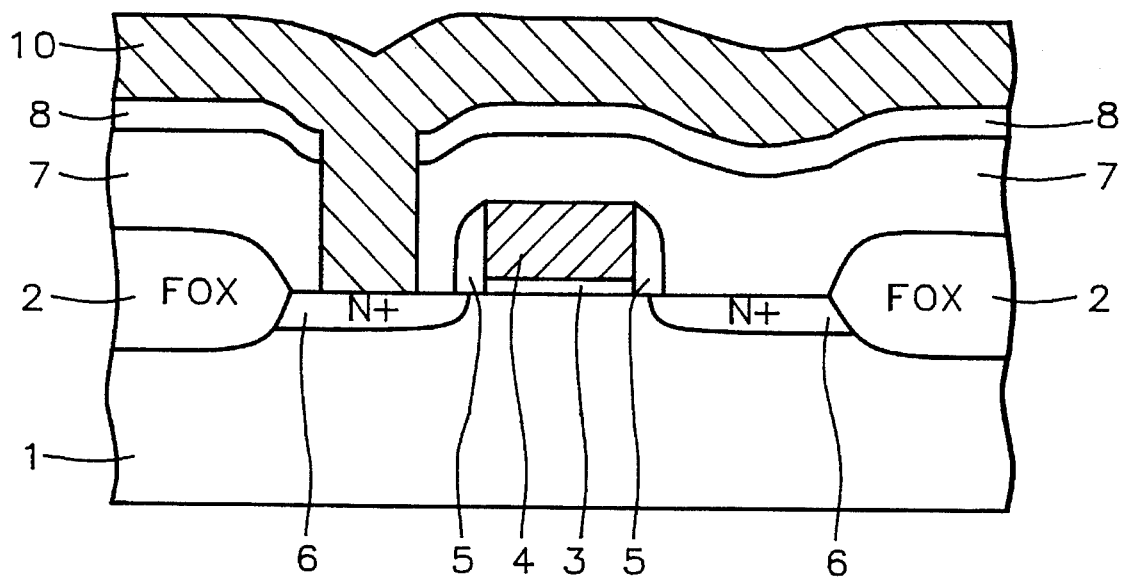

A critical buffered hydrofluoric acid procedure is now performed, for purposes of removing any native oxide from the surface of the source and drain region, 6, in the opened contact hole, 9. Next a layer of insitu doped polysilicon, 10, shown schematically in FIG. 3, is grown using LPCVD procedures, at a temperature between about 500° to 700° C. to a thickness between about 1000 to 3000 Angstroms. The deposition proceeds using a SiH4 flow between about 1200 to 1400 sccm, while an PH3 flow, used for insitu doping, is between about 100 to 300 sccm. It is critical that the thickness of polysilicon, 10, be large enough to completely fill contact hole, 9. It is also equally important that the doping level of polysilicon, 10, which will form the stud, be high enough to provide a conductive link between the underlying source and drain, 6, and subsequent metallizations. Therefore the polysilicon grown using the $SiH_4$-$PH_3$ flow rates referred to earlier, result in a polysilicon sheet resistance between about 10 to 110 ohms/square.

Figure 4:
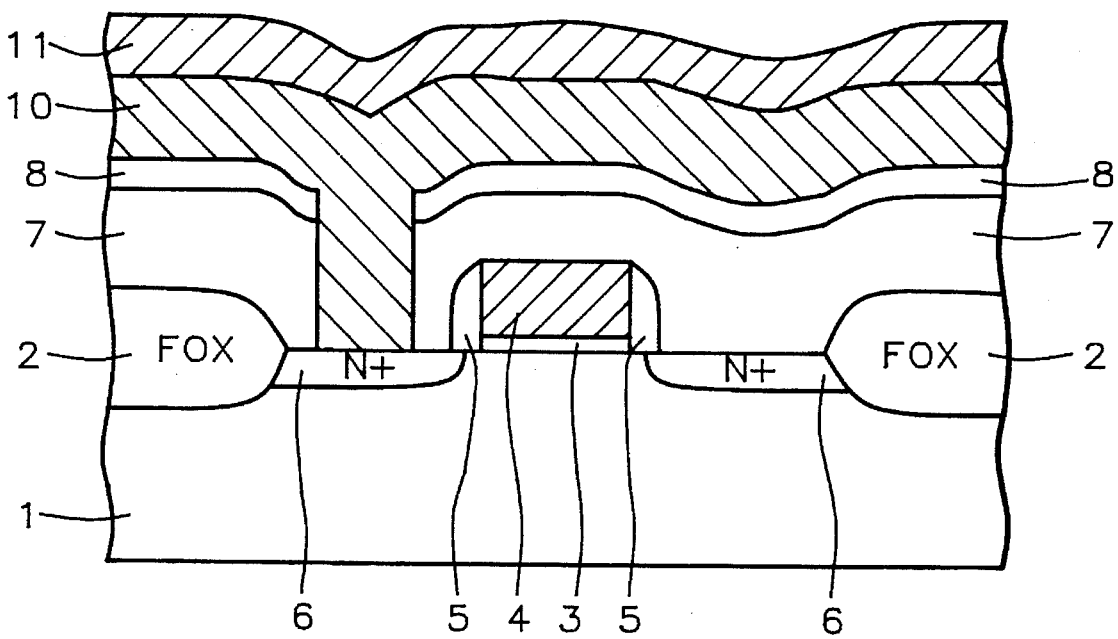
Figure 5:
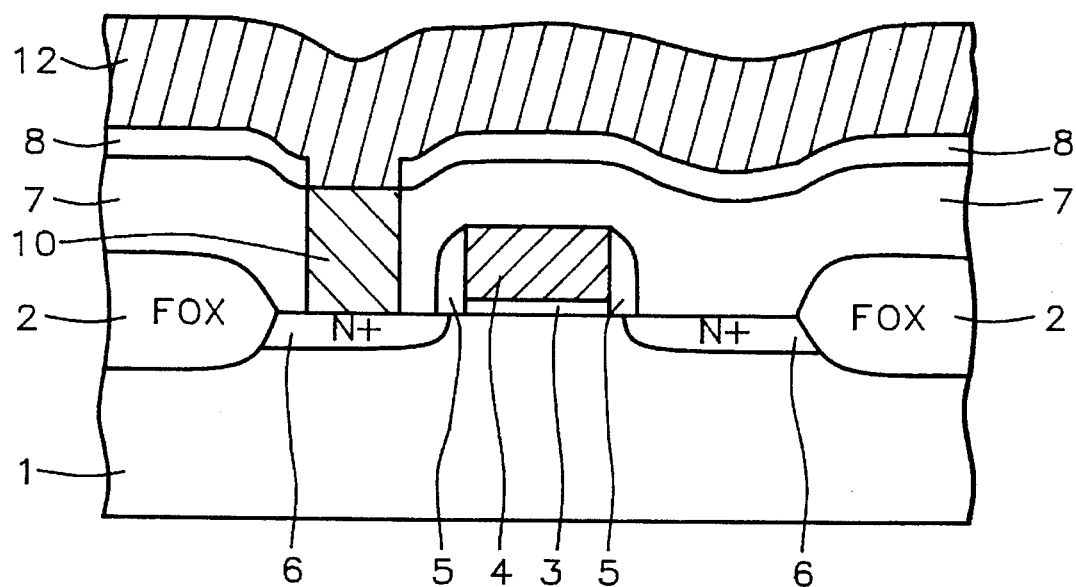

Next a layer of titanium, 11, is deposited on polysilicon layer, 10, using r.f. sputtering, to a thickness between about 500 to 2000 Angsttoms. This is shown in FIG. 4. An anneal, designed to convert a specific amount of polysilicon layer, 10, to titanium silicide, 12, is next performed using a conventional furnace process. The level of silicide formation desired, is the amount needed to convert all the polysilicon overlying the silicon nitride layer, 8, plus an additional amount needed to insure complete conversion, without deleterious residual polysilicon on the silicon nitride layer. Therefore the process is designed to not only convert to silicide, the deposited thickness of polysilicon, 10, but also designed to convert to silicide an additional amount of polysilicon 10, in the contact hole, equal to the thickness of the silicon nitride layer, 8. Therefore the thicknesses of the polysilicon, 10, and titanium, 11, layers, are carefully selected, so that the specific amount of titanium chosen will result in the desired depth of conversion to silicide, in the contact hole. The annealing conditions used for the conversion to titanium silicide, 12, include a temperature between about 400° to 600° C., using a $N_2$ ambient. FIG. 5 schematically shows this.

Figure 6:
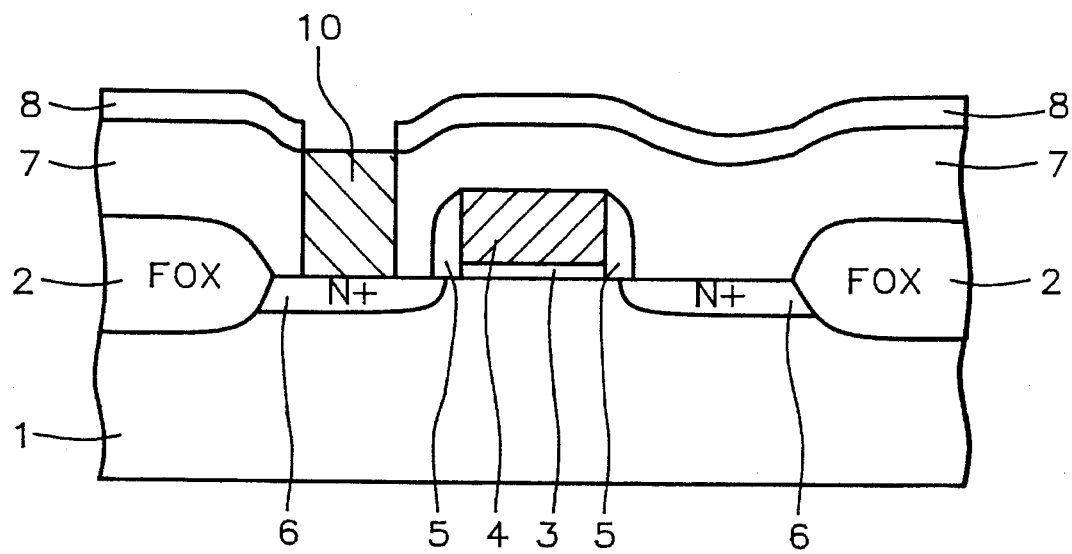
Figure 7:
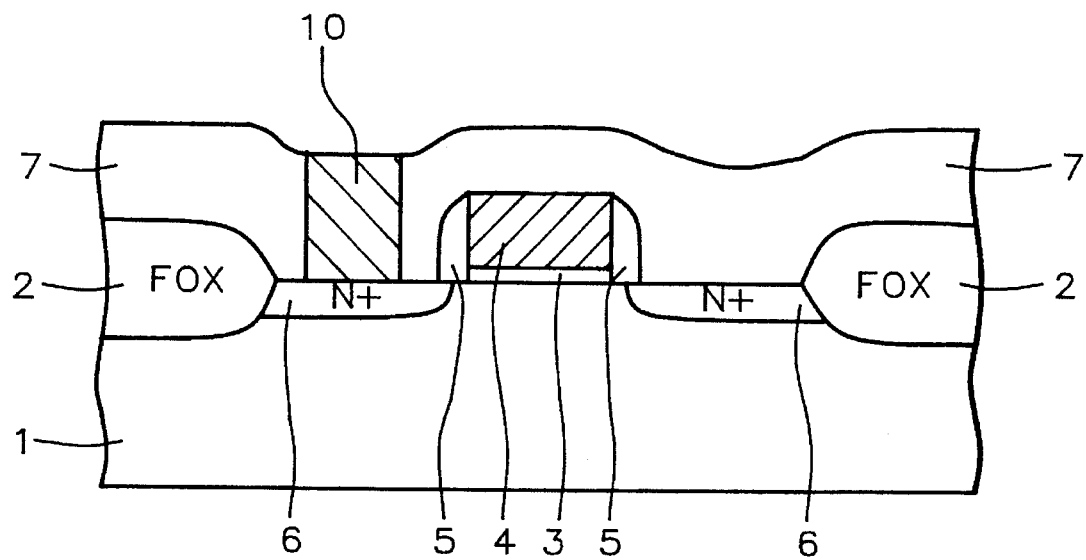

The selective removal of titanium silicide, 12, is accomplished by subjecting the structure to a hydrofluoric acid solution, at a temperature between about 20° to 25° C. The polysilicon stud, 10, remaining in the contact hole is not influenced by this etchant. This is shown schematically in FIG. 6. The polysilicon stud process is completed by removal of silicon nitride layer, 8, via use of a hot phosphoric acid solution. It can be seen in FIG. 7, that a smooth topography now exists. That is the height of the polysilicon stud, 10, is equal to the height of the silicon oxide, 7.

A metallization of Al—Cu and TiN is next performed. Conventional patterning, again using photolithographic and RIE, are employed to create metal level, 13. Thus a direct electrical path from the device source and drain region, 6, to an interconnect metal, 13, is accomplished using the polysilicon stud structure, 10.

The process for creating a polysilicon contact stud, although shown in an NFET configuration, can also be applied to PFET, as well as CMOS, (complimentary metal oxide semiconductor), devices. In addition BiCMOS, (bipolar-CMOS), type structures can also be fabricated using this invention.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a MOSFET device on a semiconductor substrate, using a conductive stud to provide electrical contact between active device elements in the substrate, and an overlying interconnect metallization, comprising the steps of:

providing the active device elements in the said semiconductor substrate;

depositing a first dielectric layer on said semiconductor substrate, that includes said active device elements;

depositing a second dielectric layer on said first dielectric layer, to form composite dielectric layer;

photolithographic processing to open a region in a photoresist layer, exposing an area of said composite dielectric layer, directly overlying said active device element;

anisotropic removal of said composite dielectric layer, in said exposed region of said photoresist layer, to create contact hole opening to said active device element;

cleaning the surface of said active device element, in said contact hole opening;

depositing an insitu doped polysilicon layer on the surface of said active device element, in said contact hole opening, and on the surface of said second dielectric layer;

depositing a layer of titanium on said insitu doped polysilicon layer;

annealing to completely convert a portion of said insitu doped polysilicon layer to a titanium silicide layer, on the surface of said second dielectric layer, while converting only a top portion of said insitu doped polysilicon layer, in said contact hole opening, to titanium silicide;

removal of said titanium silicide from the surface of said second dielectric layer, and from the surface of said unconverted insitu doped polysilicon, in said contact hole; and removal of said second dielectric layer from the surface of said first dielectric layer.

2. The method of claim 1, wherein said active device elements, in said semiconductor substrate, are N type doped diffusion regions.

3. The method of claim 1, wherein said first dielectric layer is silicon oxide, deposited using LPCVD processing, at a temperature between about 400° C. to 800° C., to a thickness between about 6000 to 12000 Angstroms.

4. The method of claim 1, wherein second dielectric layer is silicon nitride, deposited using LPCVD processing, at a temperature between about 600° to 800° C., to a thickness between about 500 to 3000 Angstroms.

5. The method of claim 1, wherein said contact hole is created using anisotropic RIE removal of said composite dielectric layer, using $Cl_2$, for said second dielectric layer, and a $CF_4$-$CHF_3$- Argon chemistry, for said first dielectric layer.

6. The method of claim 1, wherein surface of said active device element, in said contact hole opening, is cleaned using a solution of ammonium fluoride, and hydrofluoric acid, at a temperature between about 20° to 25° C., for a time between about 10 to 60 sec.

7. The method of claim 1, wherein said insitu doped polysilicon layer is deposited using LPCVD processing, at a temperature between about 500° to 700° C,. to a thickness between about 1000 to 3000 Angsttoms, using a flow between about 1200 to 1400 sccm of $SiH_4$, and a flow between about 100 to 300 sccm of $PH_3$.

8. The method of claim 1, wherein the sheet resistance of said insitu doped polysilicon layer is between about 10 to 110 ohms/square.

9. The method of claim 1, wherein said titanium layer is deposited using rf sputtering, to a thickness between about 500 to 2000 Angsttoms.

10. The method of claim 1, wherein said annealing is performed, using a furnace, at a temperature between about 400° to 600° C., for a time needed to convert between about 1000 to 2000 Angstroms of said insitu doped polysilicon to titanium silicide.

11. The method of claim 1, wherein said titanium silicide is removed using hydrofluoric acid, at a temperature between about 20° to 25° C.

12. The method of claim 1, wherein silicon nitride is removed using hot phosphoric acid.

13. A method of fabricating a MOSFET device on a semiconductor substrate, using a polysilicon contact stud to provide electrical contact between a source and drain device region in a substrate, and an overlying interconnect metallization, comprising the steps of:

providing said source and drain region in said semiconductor substrate;

depositing a silicon oxide layer on said semiconductor substrate, that includes said source and drain region;

depositing a silicon nitride layer on said silicon oxide layer, to form a composite dielectric layer;

photolithographic processing to open a region in a photoresist layer, exposing said composite dielectric layer, directly overlying said source and drain region;

anisotropic removal of said composite dielectric layer, in said exposed region in said photoresist layer, to create contact hole to said source and drain region;

cleaning the surface of said source and drain region, in said contact hole opening;

depositing an insitu doped polysilicon layer on said source and drain region, in said contact hole opening, and on said silicon nitride layer;

depositing a titanium layer on said insitu doped polysilicon layer;

annealing to completely convert said insitu doped polysilicon layer, to titanium silicide, on the surface of said silicon nitride layer, while converting only a top portion of said insitu doped polysilicon, in said contact hole opening, to titanium silicide;

removal of said titanium silicide from the surface of said silicon nitride layer, and from the top surface of said unconverted insitu doped polysilicon, in said contact hole opening; and removal of said silicon nitride layer from the surface of said silicon oxide layer.

14. The method of claim 13, wherein said source and drain region in said semiconductor substrate, is an N type doped region.

15. The method of claim 13, wherein said silicon oxide layer is grown using LPCVD processing, at a temperature between about 400° to 800° C., to a thickness between about 6000 to 12000 Angstroms.

16. The method of claim 13, wherein said silicon nitride layer is grown using LPCVD processing, at a temperature between about 600° to 800° C., to a thickness between about 500 to 3000 Angstroms.

17. The method of claim 13, wherein said contact hole, to said source and drain region, is created via RIE processing using $Cl_2$, for said silicon nitride layer, and a $CF_4$-$CHF_3$- Argon chemistry, for said silicon oxide layer.

18. The method of claim 13, wherein surface of said source and drain, in said contact hole opening, is cleaned using a solution of ammonium fluoride, and hydrofluoric acid, at a temperature between about 20° to 25° C., for a time between about 10 to 60 sec.

19. The method of claim 13, wherein said insitu doped polysilicon layer, used to create the polysilicon contact stud, is deposited using LPCVD processing, at a temperature between about 500° to 700° C., to a thickness between about 1000 to 3000 Angstroms, using a SiH4 flow between about 1200 to 1400 sccm, and a PH3 flow between about 100 to 300 sccm.

20. The method of claim 13, wherein the sheet resistance of said insitu doped polysilicon layer, used to create said polysilicon contact stud, is between about 10 to 110 ohms/square.

21. The method of claim 13, wherein said titanium layer is deposited using rf sputtering, to a thickness between about 500 to 2000 Angstroms.

22. The method of claim 13, wherein said annealing is performed, using a furnace process, at a temperature between about 400° to 600° C., for a specific amount of time needed to convert between about 1000 to 2000 Angstroms of said insitu doped polysilicon to titanium silicide.

23. The method of claim 13, wherein said titanium silicide is removed using hydrofluoric acid, at a temperature between about 20° to 25° C.

24. The method of claim 13, wherein said silicon nitride layer is removed using hot phosphoric acid.

* * * * *